United States Patent
Liu et al.

(10) Patent No.: US 10,290,636 B2
(45) Date of Patent: May 14, 2019

(54) SEMICONDUCTOR DEVICE HAVING FINS WITH IN-SITU DOPED, PUNCH-THROUGH STOPPER LAYER AND RELATED METHODS

(71) Applicants: STMICROELECTRONICS, INC., Coppell, TX (US); INTERNATIONAL BUSINESS MACHINES CORPORATION, Armonk, NY (US); GLOBALFOUNDRIES Inc., Grand Cayman (KY)

(72) Inventors: Qing Liu, Watervliet, NY (US); Chun-chen Yeh, Clifton Park, NY (US); Ruilong Xie, Schenectady, NY (US); Xiuyu Cai, Niskayuna, NY (US)

(73) Assignees: STMICROELECTRONICS, INC., Coppell, TX (US); INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 1082 days.

(21) Appl. No.: 14/461,769

(22) Filed: Aug. 18, 2014

(65) Prior Publication Data
US 2016/0049402 A1 Feb. 18, 2016

(51) Int. Cl.
*H01L 27/092* (2006.01)
*H01L 29/167* (2006.01)
(Continued)

(52) U.S. Cl.
CPC .... *H01L 27/0924* (2013.01); *H01L 21/26513* (2013.01); *H01L 21/823807* (2013.01);
(Continued)

(58) Field of Classification Search
CPC ............... H01L 27/0924; H01L 21/823892
See application file for complete search history.

(56) References Cited

U.S. PATENT DOCUMENTS 9,397,096 B2 * 7/2016 Zhu ............... H01L 21/823821
9,627,480 B2 * 4/2017 Chou ............... H01L 29/0847
(Continued)

*Primary Examiner* — Ali Naraghi
(74) *Attorney, Agent, or Firm* — Seed IP Law Group LLP

(57) ABSTRACT

A method for making a semiconductor device may include forming first and second semiconductor regions laterally adjacent one another and each comprising a first semiconductor material. The method may further include forming an in-situ doped, punch-through stopper layer above the second semiconductor region comprising the first semiconductor material and a first dopant, and forming a semiconductor buffer layer above the punch-through stopper layer, where the punch-through stopper layer includes the first semiconductor material. The method may also include forming a third semiconductor region above the semiconductor buffer layer, where the third semiconductor region includes a second semiconductor material different than the first semiconductor material. In addition, at least one first fin may be formed from the first semiconductor region, and at least one second fin may be formed from the second semiconductor region, the punch-through stopper layer, the semiconductor buffer layer, and the third semiconductor region.

23 Claims, 3 Drawing Sheets

(51) Int. Cl.
*H01L 29/161* (2006.01)
*H01L 29/10* (2006.01)
*H01L 21/8238* (2006.01)
*H01L 21/265* (2006.01)
*H01L 29/06* (2006.01)

(52) U.S. Cl.
CPC .. *H01L 21/823821* (2013.01); *H01L 29/0653* (2013.01); *H01L 29/1083* (2013.01); *H01L 29/161* (2013.01); *H01L 29/167* (2013.01); *H01L 21/823892* (2013.01)

(56) References Cited

U.S. PATENT DOCUMENTS

| | | | |
|---|---|---|---|
| 9,666,703 B2* | 5/2017 | Shea | H01L 29/7395 |
| 2014/0061820 A1* | 3/2014 | Reznicek | H01L 21/823821 |
| | | | 257/401 |
| 2015/0044829 A1* | 2/2015 | Kim | H01L 21/823807 |
| | | | 438/199 |
| 2015/0380556 A1* | 12/2015 | Ching | H01L 29/7849 |
| | | | 257/351 |

* cited by examiner

SEMICONDUCTOR DEVICE HAVING FINS WITH IN-SITU DOPED, PUNCH-THROUGH STOPPER LAYER AND RELATED METHODS

TECHNICAL FIELD

The present invention relates to the field of electronic devices and, more particularly, to semiconductor devices and related methods.

BACKGROUND

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

In some implementations, different types of semiconductor materials may be used for different device types, such as silicon for NFET devices and silicon germanium (SiGe) for PFET devices, to provide desired electron or hole conductivity, respectively. With ever-increasing device integration densities, (e.g., 10 nm and beyond), for semiconductor on insulator (SOI) implementations, FINFETS with different types of fin materials may be challenging to implement.

As such, further enhancements in semiconductor devices may be desirable in some applications, such as next generation FINFET devices with relatively small dimensions, for example.

SUMMARY

A method for making a semiconductor device may include forming first and second semiconductor regions laterally adjacent one another and each comprising a first semiconductor material, with the first semiconductor region having a greater vertical thickness than the second semiconductor region and defining a sidewall with the second semiconductor region. The method may further include forming an in-situ doped, punch-through stopper layer above the second semiconductor region comprising the first semiconductor material and a first dopant, and forming a semiconductor buffer layer above the punch-through stopper layer, where the punch-through stopper layer includes the first semiconductor material. The method may also include forming a third semiconductor region above the semiconductor buffer layer, where the third semiconductor region includes a second semiconductor material different than the first semiconductor material. In addition, at least one first fin may be formed from the first semiconductor region, and at least one second fin may be formed from the second semiconductor region, the punch-through stopper layer, the semiconductor buffer layer, and the third semiconductor region.

More particularly, the semiconductor buffer layer may be undoped. The method may further include forming an oxide between the at least one first fin and the at least one second fin. In accordance with an example embodiment, an upper level of the oxide may be below a lower level of the semiconductor buffer layer. Furthermore, a second dopant different than the first dopant may be implanted in the at least one first fin. By way of example, the first dopant may include phosphorus, and the second dopant may include boron.

The first and second semiconductor regions may be formed by selectively forming a mask overlying portions of a substrate comprising the first semiconductor material, and removing portions of the first semiconductor material laterally outside of the mask to define the second semiconductor region. By way of example, the first semiconductor material may comprise silicon, and the second semiconductor material may comprise silicon germanium. The method may further include forming at least one gate overlying the at least one first fin and the at least one second fin, as well as forming respective source and drain regions electrically coupled with the at least one first fin and the at least one second fin.

A related semiconductor device may include at least one first fin and at least one second fin laterally spaced apart from the at least on first fin. The at least one first fin may include a first semiconductor material. The at least one second fin may include a lower layer comprising the first semiconductor material, an in-situ doped, punch-through stopper layer above the lower layer comprising the first semiconductor material and a first dopant, a semiconductor buffer layer above the punch-through stopper layer and comprising the first semiconductor material, and an upper layer above the semiconductor buffer layer comprising a second semiconductor material different than the first semiconductor material.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

By way of background, for P-type FINFET devices, SiGe is a desirable fin material in that it provides for enhanced performance and $V_t$ control. However, in bulk trigate/FINFET implementations, a typical punch through stopper implantation (PTI) in the substrate (which usually is phosphorous or arsenic) may creep into the cSiGe fin bottom and diffuse very quickly into the channel region. This may result in various problems such as a $V_t$ shift, random dopant fluctuation, low mobility, etc.

Generally speaking, an approach is provided herein for controlling the diffusion of a punch-though stopper material into a semiconductor (e.g., SiGe) fin and, accordingly, the channel region. To this end, in the example of a P-type SiGe fin, a highly P-doped silicon epitaxial growth and a buffer layer with intrinsic or undoped silicon may be used below the cSiGe channel, instead of implantation, to more precisely control the junction.

Turning now to FIGS. 1-5, a semiconductor device 30 and related method for making the device are first described.

Figure 1:
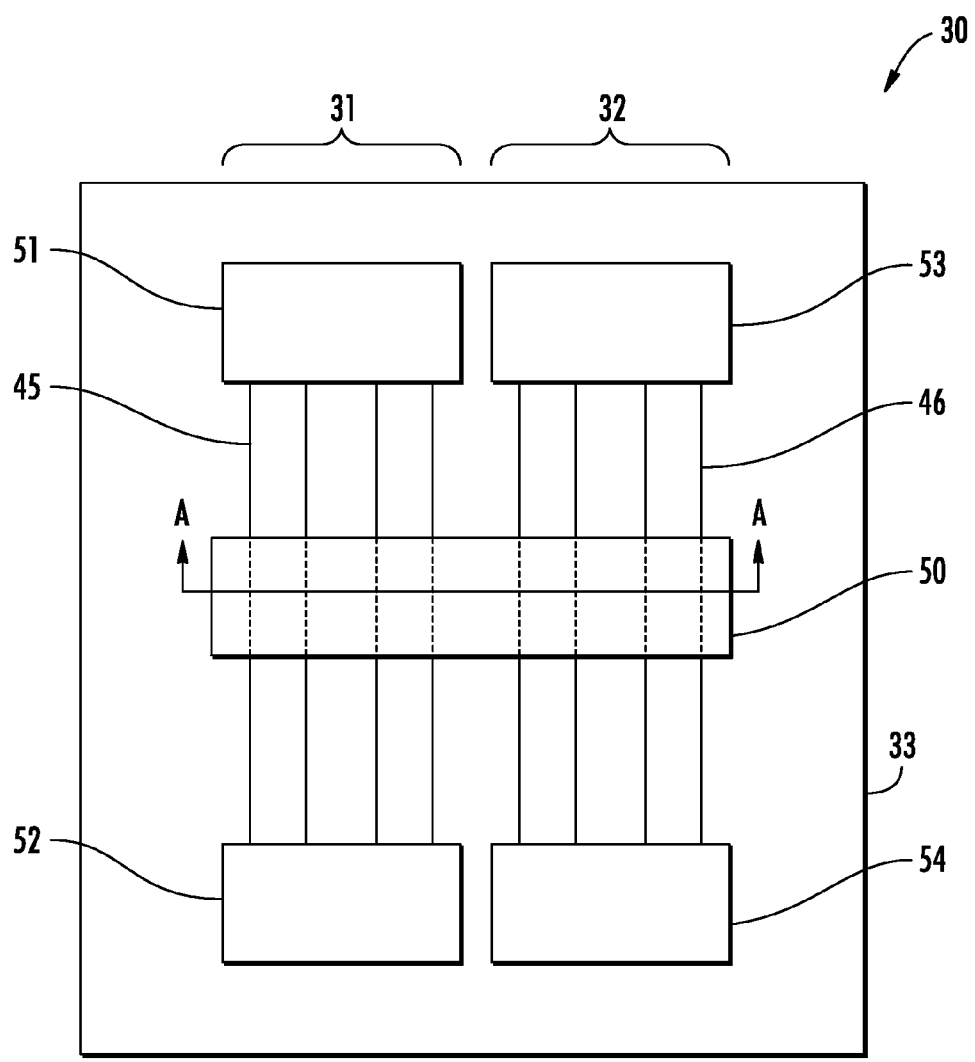
FIG. 1 is a top view of a semiconductor device in accordance with an example embodiment including fins with an in-situ doped, punch-through stopper layer.

More particularly, the semiconductor device 30 is a complementary FINFET device, in which an NFET 31 is illustratively shown on the left-hand side of FIG. 1, and a PFET 32 is shown on the right-hand side. In the illustrated example, the semiconductor device 30 is formed using a bulk semiconductor (e.g., silicon) substrate or layer 33, although other types of substrates may also be used. By way of example, the fabrication techniques described herein may also be used with SOI wafers, sSOI wafers (in which the semiconductor layer is already strained), and UTBB SOI wafers, as will be appreciated by those skilled in the art. Moreover, other configurations may also be used, such as fully-depleted SOI (FDSOI), partially-depleted SOI (PDSOI), etc.

A dielectric (e.g., $SiO_2$) layer 34 may be formed overlying the silicon layer 33, and a nitride (e.g., SiN) layer 35 may be formed overlying the dielectric layer, which serves as a hard mask. For an example implementation using a 14 nm process node, the thickness of the insulating layer 34 may be about 5 nm, while the thickness of the nitride layer 35 may be about 10 nm, although other thickness and materials may be used in different embodiments, as will be appreciated by those skilled in the art.

Figure 2:
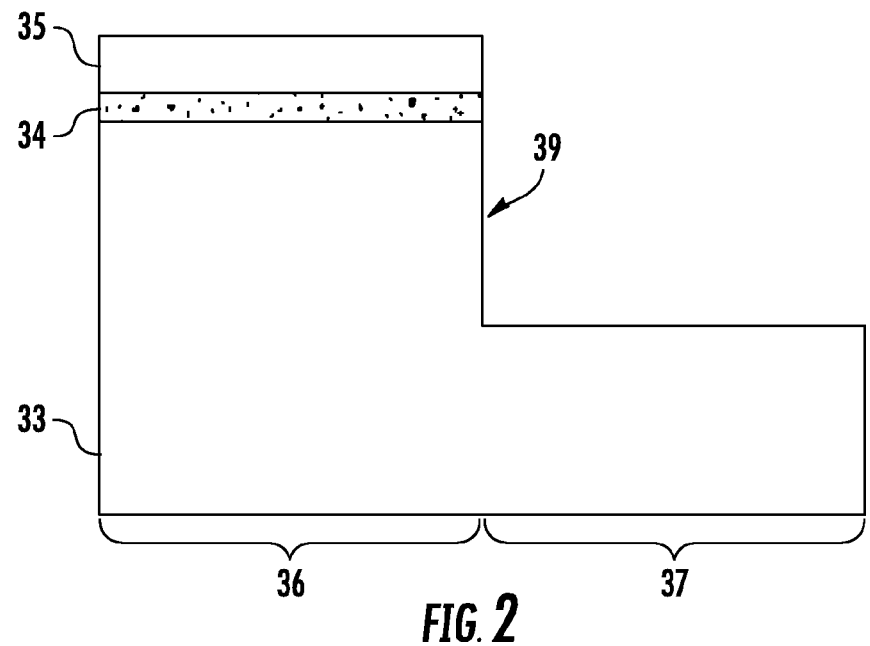
FIGS. 2-5 are a series of cross-sectional diagrams taken along line A-A of FIG. 1 and showing method aspects for making the semiconductor device thereof.

The dielectric layer 34 and nitride layer 35 may be patterned to cover a first silicon region 36 where NFET fins 45 are to be formed, and to expose a second silicon region 37 where PFET fins 46 are to be formed, as seen in FIG. 2. The silicon layer 33 may be etched in the second region 37 exposed by the openings in the nitride mask layer 35 to provide a thinned silicon portion which will provide a base or lower (bottom) layer for the PFET fins 46, as will be discussed further below. That is, the first region 36 that will be used to define or form the fins 45 for the NFET device 31 will have a greater vertical thickness or height than the second region 37 after the etch, and the boundary between the two defines a sidewall 39 of the first region 36. By way of example, the depth of the etched silicon in the second region 37 may be in a range of about 40 to 50 nm for the 14 nm process node mentioned above, although other thicknesses may be used in different embodiments.

Figure 3:
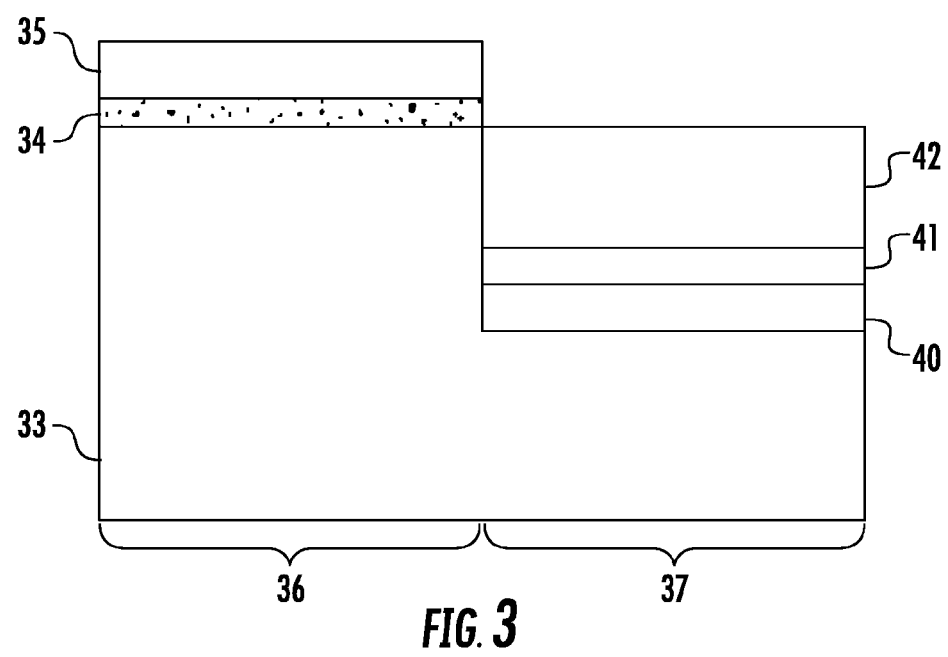

The method may further include growing an in-situ P-doped silicon punch-through stopper layer 40 overlying the second region 37, an intrinsic (undoped) silicon buffer layer 41 overlying the punch-through stopper layer, and an intrinsic silicon germanium layer 42 overlying the silicon buffer layer, as seen in FIG. 3. For the example 14 nm process node, the punch-through stopper layer 40 may include a highly doped SiP or SiCP epitaxial growth, and have a thickness of about 10 nm. Moreover, the silicon buffer layer 41 may have a thickness of about 10 nm, and the silicon germanium layer 42 may have a thickness of about 30 nm in the present example, although other dimensions may be used in different embodiments. The epitaxial growth of the punch-through stopper layer 40, the silicon buffer layer 41, and the silicon germanium layer 42 may be performed vertically by utilizing a deposition/etch cycle, so that only the bottom up epitaxial growth is retained, while the epitaxial growth from the sidewall 39 is etched away in every cycle. This allows growth of all three layer 40-42 in the same sequence and without breaking vacuum in the deposition chamber, as will be appreciated by those skilled in the art.

Figure 4:
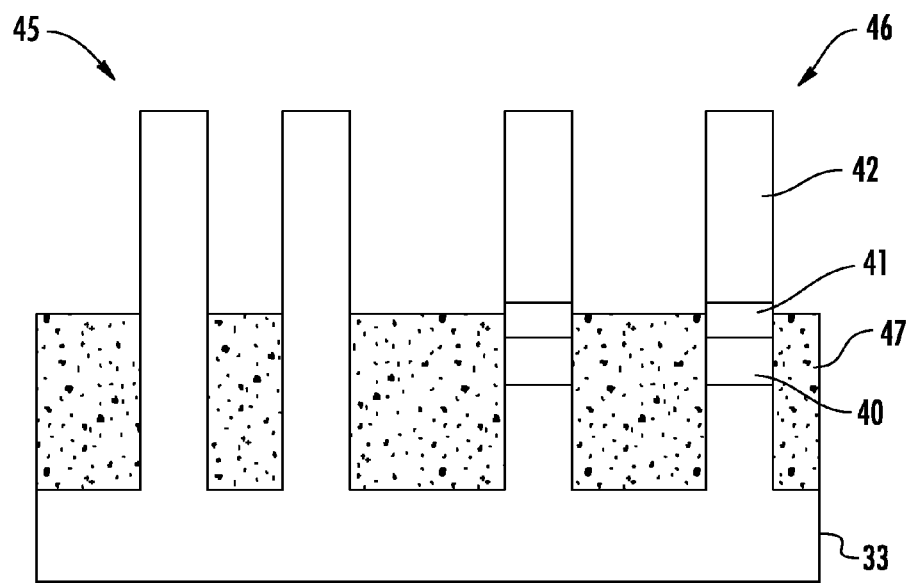
Figure 5:
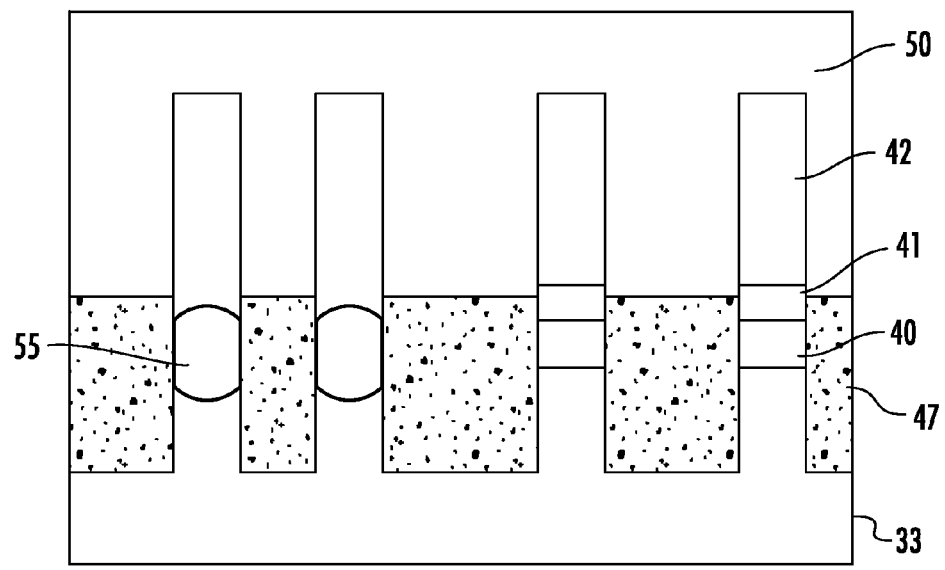

As seen in FIG. 4, the dielectric layer 34 and nitride layer 35 may be removed, NFET fins 45 and PFET fins 46 may be etched, and a local oxide 47 may be deposited and etched to reveal the NFET and PFET fins. Conventional processing steps may be performed to form a gate stack 50 (e.g., a replacement metal gate stack), along with respective raised source and drain epitaxial regions 51, 52 and 53, 54 for the NFET device 31 and PFET device 32, as seen in FIGS. 1 and 5. More particularly, during gate processing, the oxide 47 may be etched further so that the top or upper level of the oxide is below the bottom or lower level of the silicon buffer layer 41. In this way, the source and drain regions 51, 52 and 53, 54 will be isolated by the P-doped silicon of the punch-through stopper layer 40, as will be appreciated by those skilled in the art.

The silicon buffer layer 41 will partially absorb the bottom P diffusion from the punch-through stopper layer 40 (approximately 4 nm diffusion for the above-noted example dimensions), and will similarly experience germanium diffusion from above (e.g., about 2 nm). As such, approximately 4 nm of intrinsic silicon will remain as the silicon buffer layer 41 following this diffusion, using the dimensions for the example 14 nm process node discussed above, though again different thicknesses and dimensions may be used in different embodiments. NFET punch stop implantations 55 (e.g., boron) may also be formed (see FIG. 5) in some embodiments, if desired. It should also be noted that, instead of the implantation 55, an in-situ punch through stopper layer similar to that described above for the PFET 54 may be used for the NFET device 31 with different conductivity type dopants, if desired.

The above-described approach may accordingly avoid the drawbacks associated with PFET punch through stopper implants, and the associated diffusion into the silicon germanium channel. That is, the in-situ, punch-through stopper layer 40 may advantageously provide greater control over the dopant creep or diffusion, while only adding two relatively thin epitaxial deposition stages that may be combined with the silicon germanium epitaxial deposition, as noted above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a substrate;
   at least one first fin; and
   at least one second fin laterally spaced apart from the at least one first fin;
   the at least one first fin comprising a layer of a first semiconductor material that extends from the substrate to a first height;
   the at least one second fin comprising:
      a lower layer comprising the first semiconductor material, the lower layer extending from the substrate to a second height, the first height being greater than the second height;
      an in-situ doped, punch-through stopper layer above the lower layer comprising the first semiconductor material and a first dopant;
      a semiconductor buffer layer above the in-situ doped, punch-through stopper layer and comprising the first semiconductor material; and
      an upper layer above the semiconductor buffer layer comprising a second semiconductor material different than the first semiconductor material.

2. The semiconductor device of claim 1 wherein the semiconductor buffer layer is undoped.

3. The semiconductor device of claim 1 further comprising an oxide between the at least one first fin and the at least one second fin.

4. The semiconductor device of claim 3 wherein an upper level of the oxide is below a lower level of the semiconductor buffer layer.

5. The semiconductor device of claim 1 further comprising a second dopant different than the first dopant in the at least one first fin.

6. The semiconductor device of claim 5 wherein the first dopant comprises phosphorus, and wherein the second dopant comprises boron.

7. The semiconductor device of claim 1 wherein the first semiconductor material comprises silicon, and the second semiconductor material comprises silicon germanium.

8. The semiconductor device of claim 1 further comprising:
   at least one gate overlying the at least one first fin and the at least one second fin; and
   respective source and drain regions electrically coupled with the at least one first fin and the at least one second fin.

9. A device, comprising:
   a substrate;
   a first and a second semiconductor regions laterally adjacent one another on the substrate, each of the first and second semiconductor regions including a first semiconductor material, the first semiconductor region having a greater vertical thickness than the second semiconductor region;
   a first doped stopper layer on the second semiconductor region, the first doped stopper layer including the first semiconductor material and a first dopant;
   a semiconductor buffer layer on the first doped stopper layer and including the first semiconductor material;
   a third semiconductor region above the semiconductor buffer layer, the third semiconductor region including a second semiconductor material different than the first semiconductor material; and
   a first fin from the first semiconductor region and a second fin from the second semiconductor region, the first doped stopper layer, semiconductor buffer layer, and the third semiconductor region.

10. The device of claim 9 wherein the semiconductor buffer layer is undoped.

11. The device of claim 9, further comprising an oxide between the first fin and the second fin.

12. The device of claim 11 wherein an upper level of the oxide is below a lower level of the semiconductor buffer layer.

13. The device of claim 9 wherein the first fin includes a second dopant different than the first dopant.

14. The device of claim 13 wherein the first dopant comprises phosphorus and wherein the second dopant comprises boron.

15. The device of claim 9 wherein the first semiconductor material includes silicon and the second semiconductor material includes silicon germanium.

16. The device of claim 9, further comprising a gate overlying the first fin and the second fin.

17. The device of claim 9, further comprising respective source and drain regions electrically coupled with the first fin and the second fin.

18. A device, comprising:
   first and second silicon regions laterally adjacent one another, the first silicon region having a greater vertical thickness than the second silicon region;
   a stopper layer above the second silicon region including silicon and a first dopant;
   a silicon buffer layer above the stopper layer;
   a silicon germanium region above the silicon buffer layer;
   a first fin formed from the first silicon region; and
   a second fin formed from the second silicon region, the stopper layer, the silicon buffer layer, and the silicon germanium region.

19. The device of claim 18, further comprising a gate overlying the first fin and the second fin.

20. The device of claim 19, further comprising respective source and drain regions electrically coupled with the first fin and the second fin.

21. The device of claim 18 wherein the silicon buffer layer is undoped.

22. The device of claim 18, further comprising an oxide between the first fin and the second fin.

23. The device of claim 22 wherein an upper level of the oxide is below a lower level of the silicon buffer layer.

* * * * *